US011057709B2

United States Patent
Li et al.

(10) Patent No.: US 11,057,709 B2
(45) Date of Patent: Jul. 6, 2021

(54) FLEXIBLE PRINTED CIRCUIT BOARD, METHOD FOR MANUFACTURING THE SAME AND LOUDSPEAKER WITH THE SAME

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Biao Li, Shenzhen (CN); Ning Hou, Shenzhen (CN); Hao-Wen Zhong, Shenzhen (CN); Xiao-Wei Kang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 223 days.

(21) Appl. No.: 16/426,200

(22) Filed: May 30, 2019

(65) Prior Publication Data
US 2019/0281392 A1  Sep. 12, 2019

Related U.S. Application Data

(62) Division of application No. 15/663,057, filed on Jul. 28, 2017, now Pat. No. 10,524,057.

(30) Foreign Application Priority Data

Jun. 30, 2017  (CN) .......................... 201710526438.7

(51) Int. Cl.
*H04R 25/00* (2006.01)
*H04R 9/06* (2006.01)
(Continued)

(52) U.S. Cl.
CPC ............. *H04R 9/06* (2013.01); *H04R 31/006* (2013.01); *H05K 1/028* (2013.01); *H05K 1/0393* (2013.01)

(58) Field of Classification Search
CPC . H04R 9/06; H04R 7/125; H04R 7/18; H04R 9/025; H04R 29/001; H04R 31/003; H04R 9/045
See application file for complete search history.

(56) References Cited

U.S. PATENT DOCUMENTS

2014/0321691 A1* 10/2014 Kim .................... H04R 1/06
                                                381/398
2017/0245057 A1*  8/2017 Grazian ................. H04R 9/06

FOREIGN PATENT DOCUMENTS

| CN | 102316665 | 1/2012 |
| CN | 104853304 | 8/2015 |
| CN | 106332442 | 1/2017 |

* cited by examiner

*Primary Examiner* — Amir H Etesam
(74) *Attorney, Agent, or Firm* — ScienBiziP, P.C.

(57) ABSTRACT

A method for manufacturing a flexible printed circuit board comprising: providing a first flexible precursor board having a layer; adhering a first covering layer with a lower opening, a portion of the circuit layer exposed; adhering a second covering layer with an upper opening to the first covering layer, the upper opening being formed in the lower opening, and a portion of circuit layer being exposed to obtain a second flexible precursor board; providing an upper mound having a protruding portion and a lower mound having a recessed portion, moving the second flexible precursor board between the upper mound and the lower mound, the upper opening being positioned away from the protruding portion and the recessed portion, pressing the upper mound to the lower mound to press the protruding portion into the (Continued)

recessed portion; removing the upper mound and the lower mound to get the flexible printed circuit board.

3 Claims, 3 Drawing Sheets

(51) Int. Cl.
*H05K 1/03* (2006.01)
*H05K 1/02* (2006.01)
*H04R 31/00* (2006.01)

FLEXIBLE PRINTED CIRCUIT BOARD, METHOD FOR MANUFACTURING THE SAME AND LOUDSPEAKER WITH THE SAME

CROSS-REFERENCE TO RELATED APPLICATIONS

This is a divisional application of patent application Ser. No. 15/663,057, filed on Jul. 28, 2017, entitled "FLEXIBLE PRINTED CIRCUIT BOARD, METHOD FOR MANUFACTURING THE SAME AND LOUDSPEAKER WITH THE SAME", assigned to the same assignee, which is based on and claims priority to China Patent Application No. 201710526438.7 filed on Jun. 30, 2017, the contents of which are incorporated by reference herein.

FIELD

The subject matter herein generally relates to a flexible printed circuit board used as a dome and a holder supporting the dome, a method for manufacturing a flexible printed circuit board, and a loudspeaker with a flexible printed circuit board.

BACKGROUND

Conventionally, a dome and a holder supporting the dome are two independent components of a loudspeaker, the dome and the holder need to be adhered together, so a conventional loudspeaker with the dome and the holder is bulky and thick. Reducing the thickness of the loudspeaker presents challenges.

BRIEF DESCRIPTION OF THE DRAWINGS

Implementations of the present technology will now be described, by way of example only, with reference to the attached figures.

DETAILED DESCRIPTION

Figure 1:
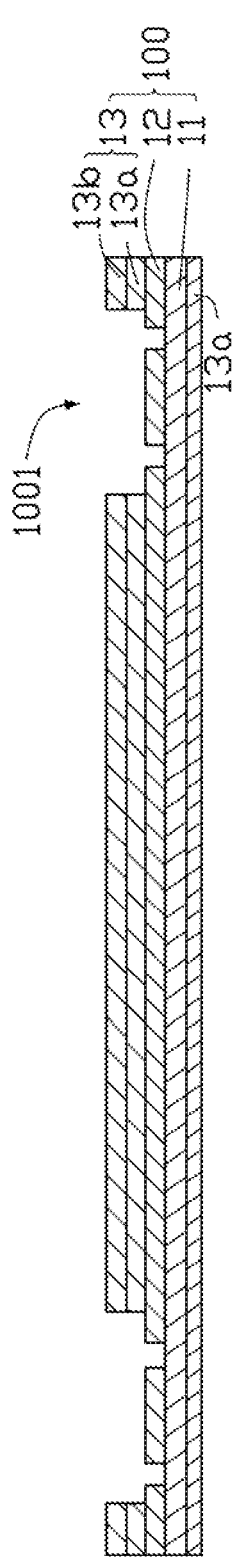
FIGS. 1-5 show a method for manufacturing a flexible printed circuit board in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 5:
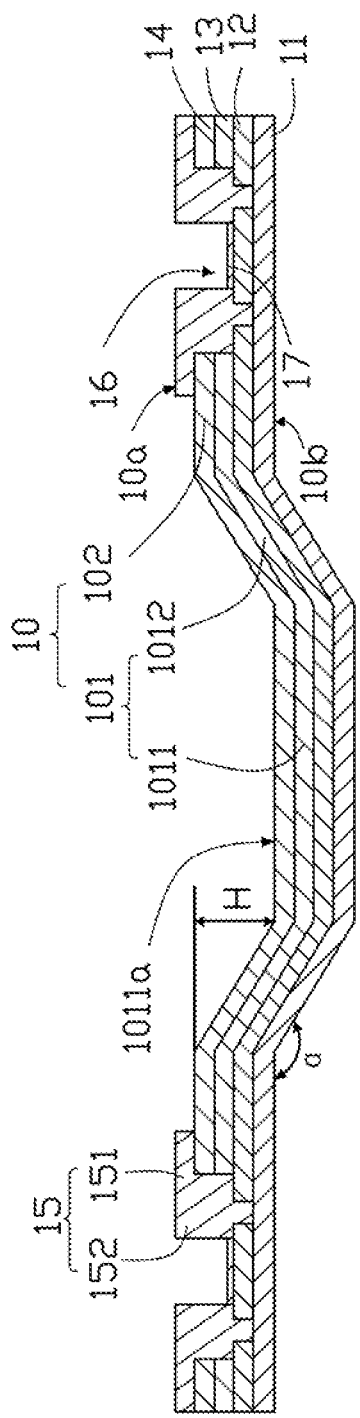

Referring to FIG. 5, a flexible printed circuit board 10 used in a loudspeaker as a dome and a holder supporting the dome is disclosed.

The flexible printed circuit board 10 has a top surface 10a and a bottom surface 10b opposite to the top surface 10a. The flexible printed circuit board 10 has a dome portion 101 and a supporting portion 102. The dome portion 101 is a recess being depressed from the top surface 10a to the bottom surface 10b. The supporting portion 102 surrounds the dome portion 101.

The dome portion 101 has a bottom wall 1011 and a side wall 1012. The bottom wall 1011 is parallel to the supporting portion 102. An angle α is defined between the side wall 1012 and the supporting portion 102. The angle α is from 90° to 180°. A depth H is a distance defined from the top surface 10a of the flexible printed circuit board 10 to a top surface 1011a of the bottom wall 1011 of the dome portion 101. The depth H is from 0 μm to 1000 μm.

The flexible printed circuit board 10 comprises at least one circuit layer 12. The flexible printed circuit board 10 has an upper opening 16. The upper opening 16 is opened at the supporting portion 102 to expose a portion of the circuit layer 12. The circuit layer 12 of the flexible printed circuit board 10 is connected to an external circuit through the upper opening 16.

The flexible printed circuit board 10 can also comprise an insulating layer 11, a first covering layer 13, and a second covering layer 15.

The insulating layer 11 can be made of PI (polyimide), PET (polyethylene terephthalate), PEN (polyethylene naphthalate), PE (polyethylene), teflon, LCP (liquid crystal polymer), or PVC (polyvinyl chloride polymer). A thickness of the insulating layer 11 can be from 12 μm to 50 μm.

The circuit layer 12 can be made of copper. A thickness of the circuit layer 12 can be from 18 μm to 50 μm.

The first covering layer 13 can be formed on the circuit layer 12. The first covering layer 13 can comprise an adhering layer 13a and a protecting layer 13b (shown in FIG. 1). The adhering layer 13a can be made of acrylic or epoxy materials. A thickness of the adhering layer 13a can be from 10 μm to 30 μm. The first covering layer 13 can be made of insulating materials. The first covering layer 13 has a lower opening 1001 (shown in FIG. 1). A portion of the circuit layer 12 is exposed by the lower opening 1001.

Figure 2:
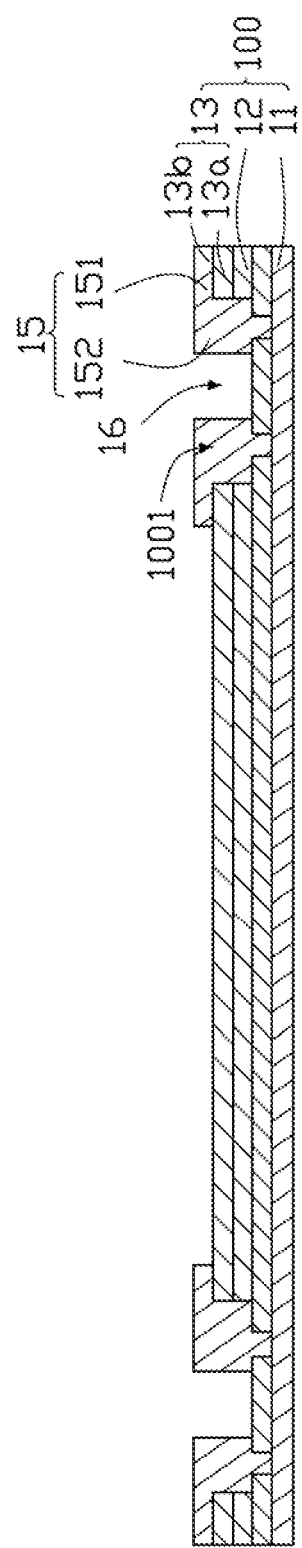

The second covering layer 15 can be formed on the first covering layer 13. The second covering layer 15 can comprise a covering portion 151 and an inserting portion 152. The covering portion 151 is formed on a top surface of the first covering layer 13. The inserting portion 152 is formed on an inner surface of the lower opening 1001 and defines the upper opening 16 as shown in FIG. 2. The second covering layer 15 can be made of insulating materials.

The flexible printed circuit board 10 can also comprise a coating layer 17. The coating layer 17 is formed on the circuit layer 12 exposed from the upper opening 16. The coating layer 17 can be made of Ni/Au alloy (nickel/gold alloy), Ag (silver), Au (gold), or Sn (tin).

Referring to FIGS. 1-5, a method for manufacturing a flexible printed circuit board 10 is provided.

Referring to FIG. 1, a first flexible precursor board 100 is provided. The first flexible precursor board 100 has at least one insulating layer 11 and at least one circuit layer 12.

The insulating layer 11 can be made of PI (polyimide), PET (polyethylene terephthalate), PEN (polyethylene naphthalate), PE (polyethylene), teflon, LCP (liquid crystal polymer), or PVC (polyvinyl chloride polymer). A thickness of the insulating layer 11 can be from 12 μm to 50 μm. An adhering panel 11a can be formed under the insulating layer 11. The adhering panel 11a can be made of acrylic or epoxy materials. The adhering panel 11a can be replaced.

The circuit layer 12 can be made of copper. A thickness of the circuit layer 12 can be from 18 μm to 50 μm.

A first covering layer 13 is provided. The first covering layer 13 has one or more lower openings 1001. The first covering layer 13 is adhered to the circuit layer 12. A portion of the circuit layer 12 is exposed by the lower opening 1001.

The first covering layer 13 can comprise an adhering layer 13a and a protecting layer 13b. The adhering layer 13a can be made of acrylic or epoxy materials. A thickness of the adhering layer 13a can be from 10 μm to 30 μm. The first covering layer 13 can be made of insulating materials.

Referring to FIG. 2, a second covering layer 15 is provided. The second covering layer 15 has an upper opening 16. The second covering layer 15 is adhered to the first covering layer 13. An inner diameter of the upper opening 16 is less than an inner diameter of the lower opening 1001. The upper opening 16 is formed in the lower opening 1001. A portion of the circuit layer 12 is exposed by the upper opening 16. A second flexible precursor board 200 is produced.

The second covering layer 15 can comprise a covering portion 151 and an inserting portion 152. The covering portion 151 is formed on a top surface of the first covering layer 13. The inserting portion 152 is formed on an inner surface of the lower opening 1001 and defines the upper opening 16. The second covering layer 15 can be made of insulating materials.

Figure 3:
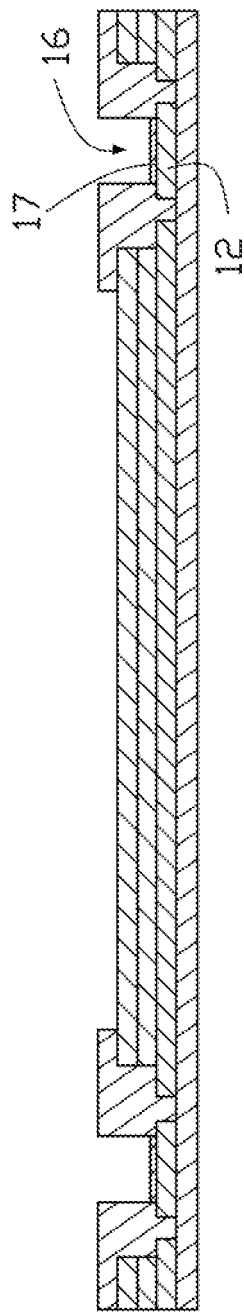

Referring to FIG. 3, a coating layer 17 is formed on the circuit layer 12 exposed from the upper opening 16. The coating layer 17 can be made of Ni/Au, Ag, Au, or Sn.

Figure 4:
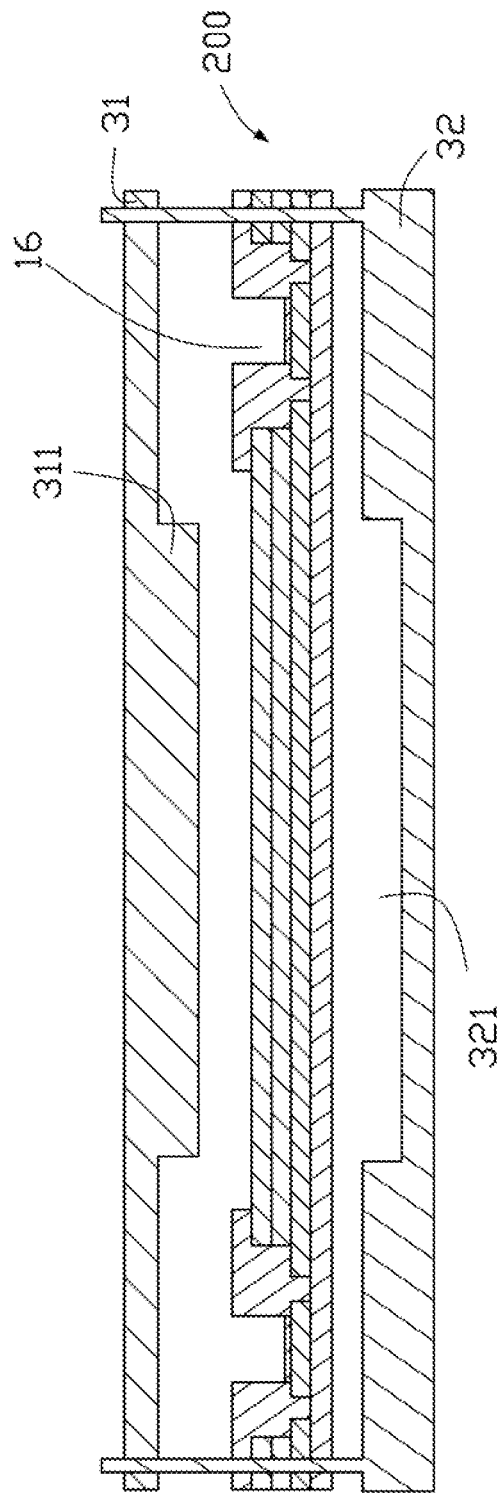

Referring to FIG. 4, an upper mound 31 and a lower mound 32 are provided. The upper mound 31 has a protruding portion 311. The lower mound 32 has a recessed portion 321. The second flexible precursor board 200 is placed between the upper mound 31 and the lower mound 32. A portion of the second flexible precursor board 200 is positioned between the protruding portion 311 and the recessed portion 321. A periphery of the second flexible precursor board 200 is positioned away from the protruding portion 311 and the recessed portion 321. The upper opening 16 is positioned away from the protruding portion 311 and the recessed portion 321. The upper mound 31 is pressed to the lower mound 32. The protruding portion 311 is pressed into the recessed portion 321.

Referring to FIG. 5, the upper mound 31 and the lower mound 32 are removed to obtain the flexible printed circuit board 10.

Figure 6:
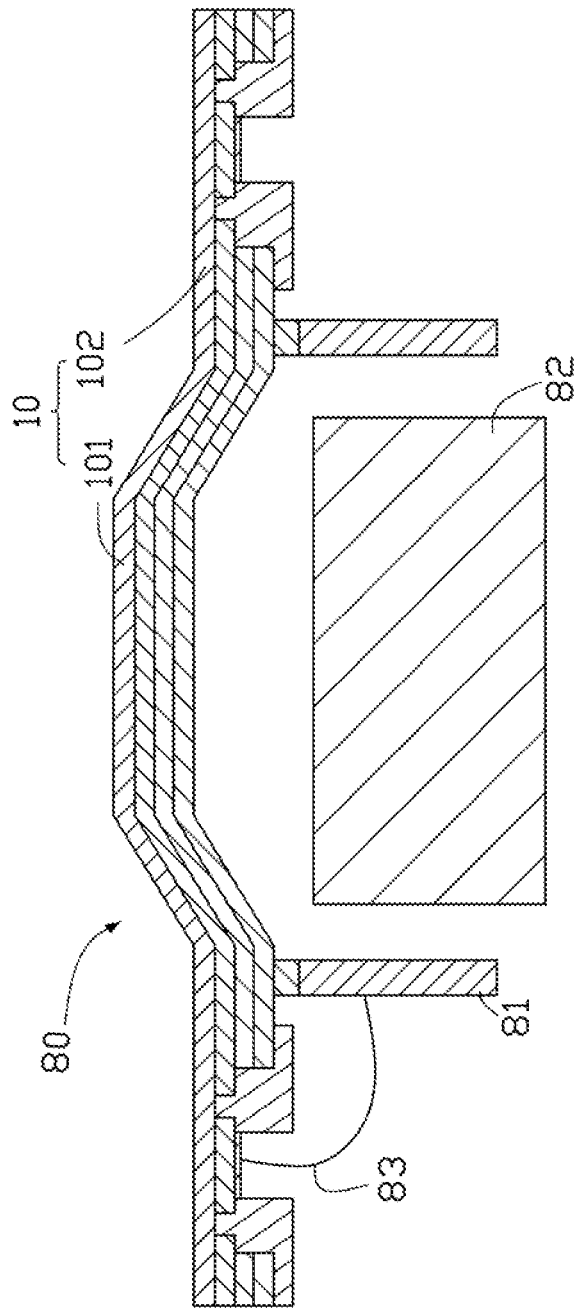
FIG. 6 is a cross section view of a loudspeaker with the flexible printed circuit board of FIG. 5 in accordance with an exemplary embodiment of the present disclosure.

Referring to FIG. 6, a loudspeaker 80 is also disclosed. The loudspeaker 80 comprises the flexible printed circuit board 10 used as a dome and a holder supporting the dome, a voice coil 81, and a magnet 82.

The voice coil 81 is adhered to the supporting portion 102 of the flexible printed circuit board 10. The voice coil 81 is away from the dome portion 101. The voice coil 81 surrounds the magnet 82. The dome portion 101 is positioned over the magnet 82. A wire 83 electrically connects the circuit layer 12 of the flexible printed circuit board 10 and the voice coil 81 through the upper opening 16.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a flexible printed circuit board, the method comprising:
   providing a first flexible precursor board having at least one circuit layer;
   adhering a first covering layer with a lower opening to the circuit layer, a portion of the circuit layer exposed by the lower opening;
   adhering a second covering layer with an upper opening to the first covering layer, the upper opening being formed in the lower opening, and a portion of circuit layer being exposed by the upper opening to obtain a second flexible precursor board;
   providing an upper mold having a protruding portion and a lower mold having a recessed portion, moving the second flexible precursor board between the upper mold and the lower mold, a portion of the second flexible precursor board being positioned between the protruding portion and the recessed portion, a periphery of the second flexible precursor board being positioned away from the protruding portion and the recessed portion, the upper opening being positioned away from the protruding portion and the recessed portion, pressing the upper mold to the lower mold to press the protruding portion into the recessed portion; and
   removing the upper mold and the lower mold to obtain the flexible printed circuit board.

2. The method of claim 1, wherein the second covering layer comprises a covering portion and an inserting portion, the covering portion is formed on a top surface of the first covering layer, and the inserting portion is received on an inner surface of the lower opening and defines the upper opening.

3. The method of claim 1 further comprises forming a coating layer on the circuit layer exposed from the upper opening after getting the second flexible precursor board.

* * * * *